United States Patent [19]

Koike et al.

[11] 4,300,960
[45] Nov. 17, 1981

[54] METHOD OF MAKING A LIGHT EMITTING DIODE

[75] Inventors: Susumu Koike, Kawachinagano; Hitoo Iwasa, Ibaraki, both of Japan

[73] Assignee: Matsushita Electric Industrial Co., Ltd., Kadoma, Japan

[21] Appl. No.: 131,413

[22] Filed: Mar. 18, 1980

[30] Foreign Application Priority Data

Mar. 19, 1979 [JP] Japan .................................. 54-32792

[51] Int. Cl.³ .......................................... H01L 21/208
[52] U.S. Cl. .................................... 148/171; 148/172; 29/569 L
[58] Field of Search ............... 148/171, 172; 29/569 L

[56] References Cited

U.S. PATENT DOCUMENTS

| 3,578,513 | 5/1971 | Pilkuhn et al. | 148/171 |
| 3,589,336 | 6/1971 | Bergh | 148/171 X |
| 3,690,964 | 9/1972 | Saul | 148/171 |
| 3,703,671 | 11/1972 | Saul | 148/171 X |
| 3,951,699 | 4/1976 | Naito et al. | 148/171 |
| 3,951,700 | 4/1976 | Beppu et al. | 148/171 |
| 4,017,880 | 4/1977 | Kasami et al. | 148/171 X |
| 4,051,061 | 9/1977 | Bhargava et al. | 148/172 X |
| 4,154,630 | 5/1979 | Diguet et al. | 148/171 |
| 4,180,423 | 12/1979 | Naito et al. | 148/172 X |

Primary Examiner—G. Ozaki
Attorney, Agent, or Firm—Cushman, Darby & Cushman

[57] ABSTRACT

A method of making a light emitting diode by a liquid phase epitaxial growth is disclosed, the method comprising the steps of growing a first p-type epitaxial layer from a gallium melt containing Zn, and $Ga_2O_3$ and GaP on an n-type GaP substrate, or on an n-type epitaxial layer formed on an n-type GaP substrate, at a cooling rate greater than 3° C./min., and growing a second p-type epitaxial layer from the gallium melt on the first p-type epitaxial layer at a cooling rate less than 1.5° C./min. This procedure makes the p-type carrier density high at the surface region of the second p-type epitaxial layer and the density of Zn-O pairs high in the first p-type epitaxial layer.

8 Claims, 6 Drawing Figures thickness of p-type
epitaxial layer p-n junction
interface

METHOD OF MAKING A LIGHT EMITTING DIODE

TITLE OF THE INVENTION

A method of making a light emitting diode

BACKGROUND OF THE INVENTION

1. Field of the Invention

The present invention relates to a method of making a light emitting diode, in particular a GaP red light emitting diode (hereinafter referred to as GaP red LED) for attaining a superior forward characteristic and high intensity of light.

2. Prior Arts

A GaP red LED emits light by utilizing an exciton recombination phenomenon due to Zn-O pairs as nearest neighbor pairs inside a p-type epitaxial layer. Previously, such Zn-O pairs are produced in the GaP red LED after carrying out the following processing procedures:

(i) Zn and then O in a form of $Ga_2O_3$ are doped in a Ga melt containing polycrystalline GaP, (ii) this solution is heated at a temperature of 1,000°–1,060° C. thereby sufficiently heating the doped melt, then (iii) the surface of an n-type GaP substrate is contacted with the melt for a predetermined period, (iv) a p-type epitaxial layer containing Zn and O is grown on the n-type GaP substrate by cooling the system at a cooling rate of 3° to 10° C./min., and finally (v) a heat treatment lasting for a specified time, e.g., 15 hours is performed on the n-type GaP substrate with a p-n junction at a low temperature around 600° C.

FIG. 1 is a graph showing the abovementioned procedures with respect to a relationship between time duration and processing temperature. The treatment temperature is on the ordinate scale, while the time is on the abscissa. The conventional method of forming the GaP red LED comprises the steps of producing the melt by heating at 1,000°–1,060° C. for about 60 minutes between $t=t_0$ and $t=t_1$, contacting the surface of the n-type GaP substrate with the melt at the same temperature for about 30 minutes between $t=t_1$ and $t=t_2$, growing the p-type epitaxial layer containing Zn and O atoms by cooling down the n-type GaP substrate at a specified cooling rate of e.g. 3°–10° C./min. between $t=t_2$ and $t=t_3$, carrying out further cool-down between $t=t_3$ and $t=t_4$ at a cooling rate of e.g. 10° C./min., and then carrying out the heat treatment at about 600° C. for, e.g., 15 hours between $t=t_4$ and $t=t_5$ to form of the Zn-O pairs.

In order to increase the light intensity of the GaP red LED, it is necessary to increase the concentration of the Zn-O pairs acting as radiative recombination centers in the p-type epitaxial layer, to decrease the number of free holes serving as non-radiative recombination centers, and to improve an injection efficiency of the electrons into the p-type layer.

The Zn-O pairs consisting of Zn as an acceptor and O as a donor are electrically neutral. This means that the carrier density in the p-type epitaxially grown layer decreases after the heat treatment which is made for the purpose of the formation of the Zn-O pairs. The decrease of the carrier density has a tendency as shown in FIG. 2. That is, the carrier density gradually decreases from the inside part towards the surface part of the p-type epitaxial layer. The decrease of the carrier density makes it difficult to form a contact of good ohmic characteristics at the p-type epitaxial layer. In addition, due to the decrease the spreading resistance of the contact area and the series resistance of the p-type epitaxial layer increase, and accordingly the forward characteristic as one of the important characteristics for an LED is degraded.

In order to avoid such difficulties, several methods are employed. For example, p-type impurities are additionally diffused into the p-type epitaxial layer formed on the n-type GaP substrate thereby increasing the carrier density at the surface region. Alternatively, a $p^+$-type epitaxial layer having a large carrier density is further grown on the p-type epitaxial layer by use of Zn. After increasing the carrier concentration at the surface region, a contact region is formed thus making a GaP red LED. However, in the former method, the additional diffusion of the p-type impurities is carried out at a temperature much higher than the heat treatment temperature (around 600° C.) for the formation of the Zn-O pairs, and accordingly the separation of the Zn-O pairs takes place. This separation is reflected by the difficulty the emission intensity is drastically reduced by the additional diffusion. On the other hand, in the latter method, an epitaxial growing process employing two kinds of solutions is required, thus remarkably lowering the processing efficiency.

SUMMARY OF THE INVENTION

The present invention provides a GaP red LED which is superior in the forward characteristic and emits high intensity light.

DESCRIPTION OF THE PREFERRED EMBODIMENTS

A method of making a light emitting diode by a liquid phase epitaxial method in accordance with the present invention comprises the steps of growing a first p-type epitaxial layer from a gallium melt containing Zn, $Ga_2O_3$ and GaP on an n-type GaP substrate at a cooling rate more than 3° C. per minute, and growing a second p-type epitaxial layer from said gallium melt on said first p-type epitaxial layer at a cooling rate less than 1.5° C. per minute.

The present inventors noted the fact that distribution coefficients of Zn and O in an epitaxially grown layer are different from each other, depending on cooling rates during the epitaxial growth. The present invention is based on this fact and relates to an improvement in making a GaP red LED by growing a first p-type epitaxial layer containing acceptors of a low impurity density and a second p-type epitaxial layer containing acceptors of a high impurity density. The resultant GaP red LED in accordance with the present invention is superior in the forward characteristic and emits high intensity light.

Figure 1:
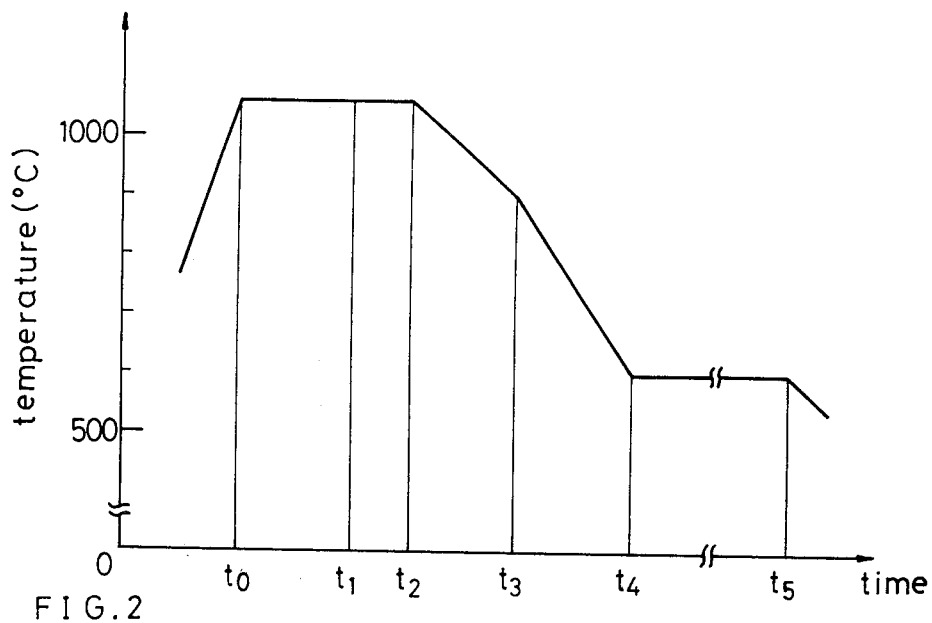
FIG. 1 is a graph illustrating the conventional epitaxial growth procedures with respect to a relationship between time duration and processing temperature.
Figure 2:
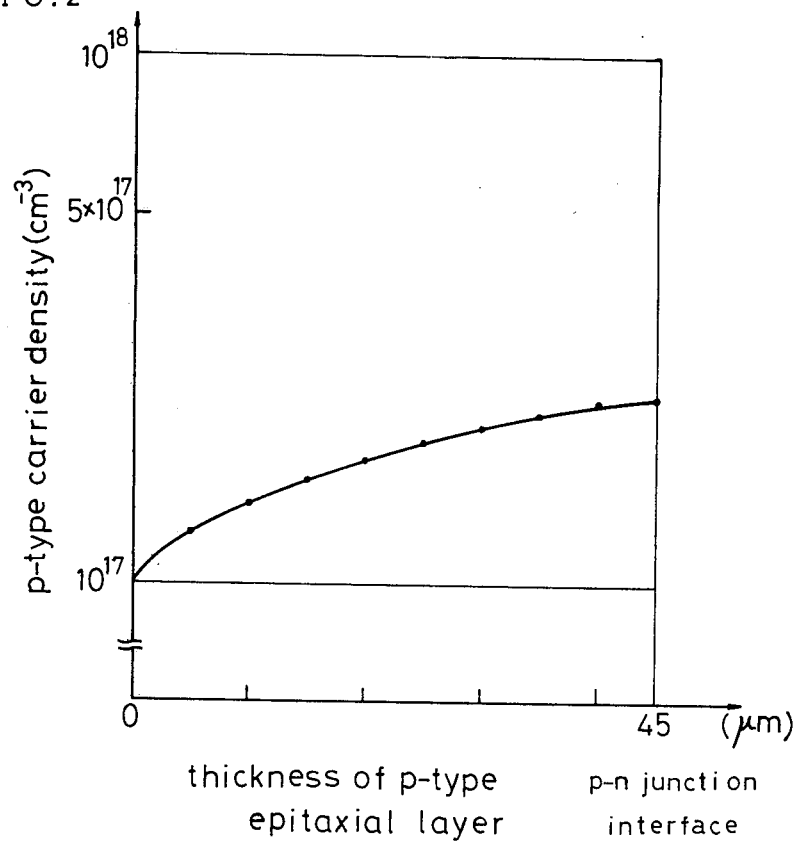
FIG. 2 is a graph showing the distribution of a carrier density in a conventional light emitting diode with respect to a depth from the surface of a p-type epitaxial layer.
Figure 3:
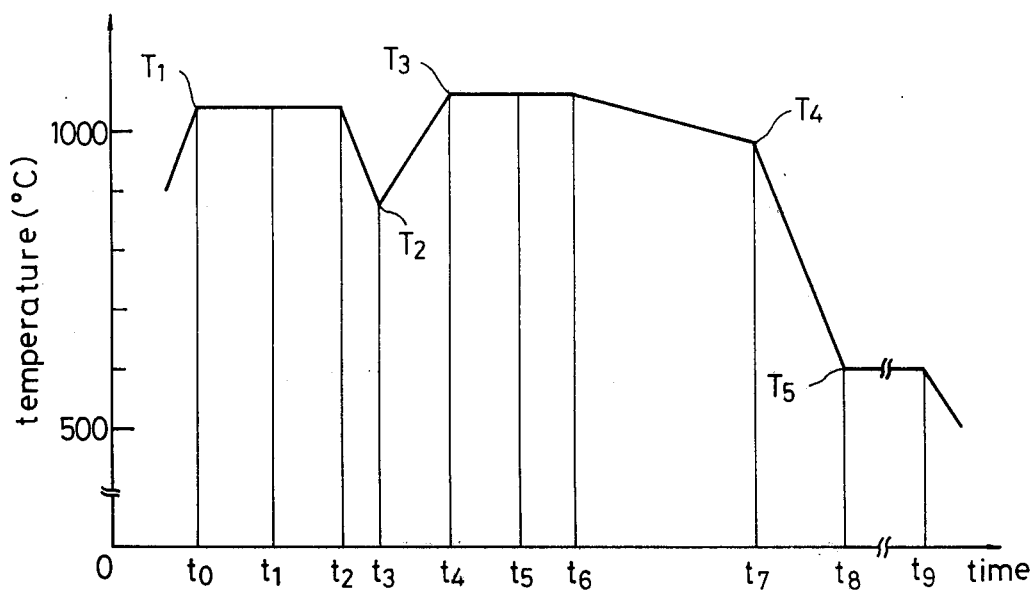
FIG. 3 is a graph illustrating epitaxial growth procedures of the present invention with respect to a relationship between time duration and processing temperature.
Figure 4:
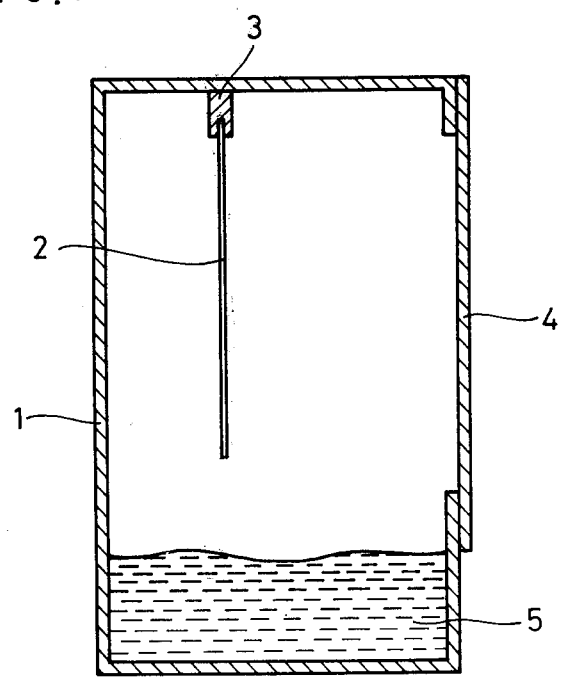
FIG. 4 is a cross-sectional view of a boat used for an epitaxial growth in the procedures of FIG. 3.

The present invention is elucidated by referring to FIG. 3-FIG. 6. FIG. 3 is a graph showing epitaxial growth procedures of the present invention with respect to a relationship between a time duration and a processing temperature. FIG. 4 is a cross-sectional view of a boat used for an epitaxial growth in the procedures of FIG. 3. Zn of 0.02 mol %, $Ga_2O_3$ of 0.1 mol % are melted with supersaturated polycrystalline GaP of such an amount that prevents melt-back of the substrate when growing a second p-type epitaxial layer described below. All compositions are measured with respect to a Ga solution. The melt is mixed at the bottom part of a boat 1 with a holding means 3 and an opening cover 4. An n-type GaP substrate 2 is held by the holding means 3 fixed at the top wall of the boat 1. The mixed melt is heated at a temperature of $T_1 = 1,040°$ C. for 30–90 minutes (from $t_0$ to $t_1$). Then the boat 1 is rotated so as to bring the melt into contact with the principal surface of the n-type GaP substrate 2. This rotating position is maintained for 20–60 minutes (from $t_1$ to $t_2$). The melt is then gradually cooled down at a cooling rate of 5°–10° C. per minute until a specified thickness of a first p-type epitaxially grown layer and a specified Zn density therein are obtained at a temperature of $T_2 = 880°$ C. At this moment, the boat 1 is rotated in the reverse direction so as to separate the surface of the first p-type epitaxial layer from the melt. This ends the first epitaxial growth.

And then, the solution is once more heated for about 60 minutes (from $t_3$ to $t_4$) to obtain a melt of a temperature of $T_3 = 1,060°$ C. Following the retention of the solution temperature at $T_3$ for 60 minutes (from $t_4$ to $t_5$), the boat 1 is rotated again so as to bring the surface of the first p-type epitaxial layer into contact with the melt for 20–60 minutes (from $t_5$ to $t_6$), further maintaining the solution temperature at $T_3$. Then, the melt is cooled down once more at a cooling rate of 0.5°–1.5° C. per minute from $t_6$ until the solution temperature becomes $T_4 (=980°$ C.) at $t_7$. At this moment, the boat 1 is rotated so as to separate the surface of the second p-type epitaxially grown layer from the solution. This ends the second epitaxial growth. And finally, a heat treatment is carried out on the n-type GaP substrate with the two p-type epitaxial layers for a specified time, e.g. 15 hours (from $t_8$ to $t_9$) at $T_5 (=600°$ C.) for the formation of the Zn-O pairs.

Figure 5:
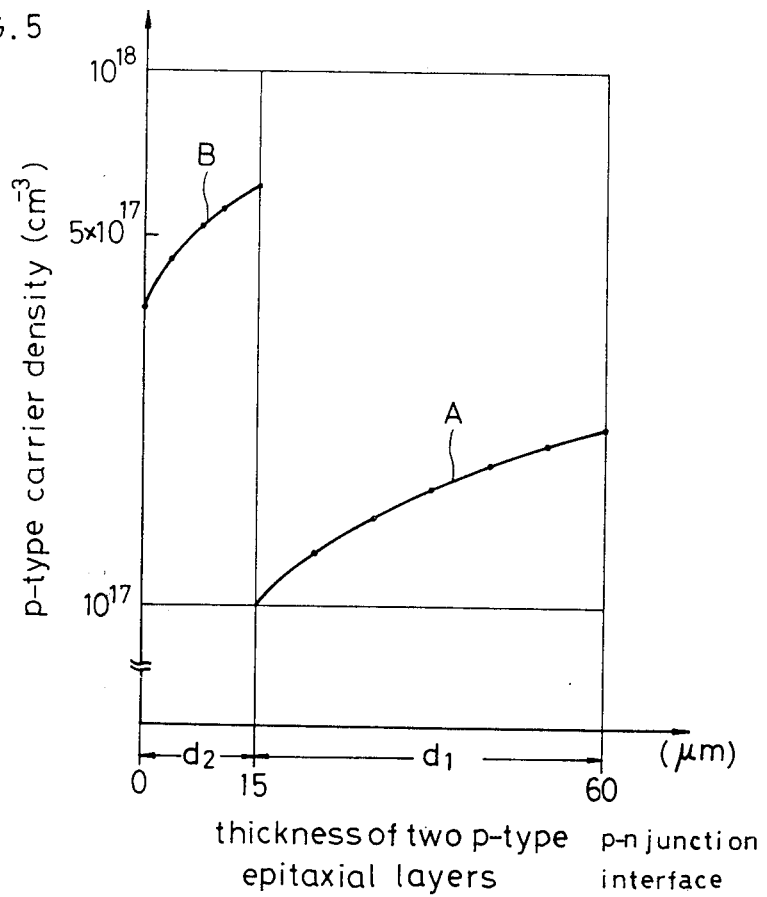
FIG. 5 is a graph showing distribution of a carrier density in a GaP red LED of the present invention with respect to a depth from the surface of a p-type epitaxial layer.

FIG. 5 is a graph showing distribution of a carrier density in the epitaxially grown layers with respect to thicknesses of the two p-type epitaxial layers. The thicknesses are measured from the surface of the second p-type epitaxial layer.

The first p-type epitaxial layer is about 45 $\mu$m ($=d_1$) in thickness. It contains O atoms of $3 \times 10^{17}$ per $cm^3$ and Zn atoms of $4 \times 10^{17}$ per $cm^3$ at the surface (i.e. the interface between the two p-type epitaxial layers). Zn atoms are doped to such an amount of $7 \times 10^{17}$ $cm^{-3}$ at the p-n junction region. O atoms are distributed uniformly in the first p-type epitaxial layer. As a result of the compensation, the p-type carrier density in the first p-type epitaxial layer is $1-4 \times 10^{17}$ $cm^{-3}$ as shown by a curve A of FIG. 5.

On the other hand, the second p-type epitaxial layer is about 15 $\mu$m ($=d_2$) in thickness. It is grown at the cooling rate of 0.5°–1.5° C. per minute from the starting temperature of 1,060° C. When the melt is heated to a temperature of 1,040° C. or higher, the distribution coefficient of O atoms towards GaP becomes smaller. Besides, due to the slow cooling rate (0.5°–1.5° C. per minute) O atoms are hardly introduced into GaP. Therefore, the second p-type epitaxial layer contains O atoms of a concentration less than $3 \times 10^{17}$ $cm^{-3}$ and Zn atoms of $7-8 \times 10^{17}$ $cm^{-3}$. This means that the compensation of Zn atoms by O atoms is small resulting in producing a p-type carrier density much higher than that of the first p-type epitaxial layer, as shown by a curve B of FIG. 5.

Therefore, it is possible to form a contact region of good ohmic characteristic in the second p-type epitaxial layer. In addition, the spreading resistance of the contact region as well as the resistivity of the second p-type epitaxial layer is lowered, thus preventing voltage increase of the forward direction. On the other hand, the carrier recombination occurs in the first p-type epitaxial layer, which is a layer of a low impurity density and contains a number of Zn-O pairs thereby enabling the emission of high intensity light. It is also possible to apply the abovementioned processing procedures to a GaP red LED formed by use of an n-type GaP substrate with an n-type epitaxial layer grown thereon.

Figure 6:
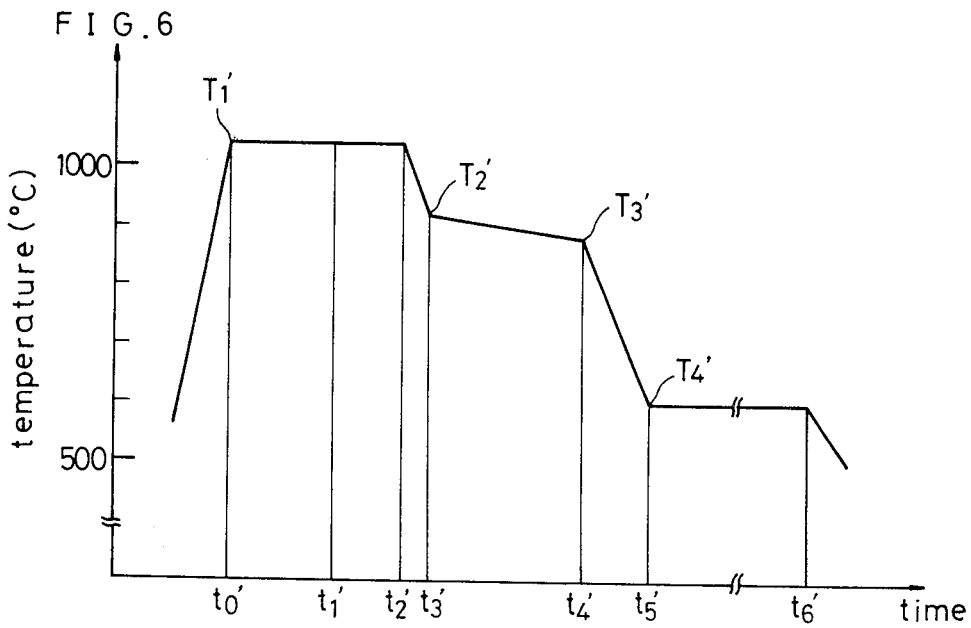
FIG. 6 is a graph illustrating epitaxial growth procedures of another embodiment of the present invention with respect to a relationship between time duration and processing temperature.

Another embodiment of the processing procedures in accordance with the present invention is elucidated below referring to FIG. 6. FIG. 6 is a graph illustrating epitaxial growth procedures embodying the present invention. The epitaxial growth is carried out by employing a melt of the same composition as the case of FIG. 3. The mixed solution is heated at a temperature of $T_1' (=1,040°$ C.) for 30–90 minutes (from $t_0'$ to $t_1'$) thereby sufficiently heating the melt. At the next procedure, the surface of an n-type GaP substrate is contacted with the melt for 30–60 minutes (from $t_1'$ to $t_2'$) at $T_1'$. Then, the n-type GaP is separated from the melt and is cooled down at a cooling rate of 5.5° C. per minute from $t_2'$ to $t_3'$ to a specified temperature $T_2' (=920°$ C.). A first p-type epitaxial layer is grown in this cooling procedure.

This GaP substrate with the melt remaining on the first p-type epitaxial layer is further cooled down at a cooling rate of 0.3° C. per minute from $t_3'$ to $t_4'$ to a specified temperature $T_3' (=880°$ C.). This forms the growth of a second p-type epitaxial layer. And finally, the n-type GaP substrate with two epitaxial layers is subjected to a heat treatment at 500°–600° C. for a specified time, e.g. 15 hours (from $t_5'$ to $t_6'$) thereby forming a number of Zn-O pairs.

Contrary to the aforementioned first embodiment, in this second embodiment the starting temperature for growing the second p-type epitaxial is 920° C. which is lower than that of the first embodiment. Since the cooling rate of 0.3° C. per minute is low, the mixing rate of O atoms into the second p-type epitaxial layer is low, resulting in a density which is lower than $10^{17}$ cm$^{-3}$. As a result of such a low density, when compensated, the p-type carrier density in the second p-type epitaxial layer becomes much higher than the surface carrier concentration of the first p-type epitaxial layer thus providing a means to solve the underlying objects of the present invention.

The abovementioned two embodiments of the present invention utilize the difference between the mixing rates of Zn and O atoms into the epitaxially grown layer. The difference depends on the cooling rate during both of the epitaxial growths as described above and listed below:

(i) cooling rate O atoms are sufficiently more than 3° C./min. mixed, (ii) cooling rate mixing rate of O atoms between 3° C./min. and 1.5° C./min. gradually decreases, (iii) cooling rate mixing rate of O atoms between 1.5° C./min. and 0.3° C./min. drastically decreases, (iv) cooling rate mixing rate of O atoms less than 0.3° C./min. is negligible.

In conclusion, the method of making a GaP red LED in accordance with the present invention can grow plural epitaxial layers with different carrier density by selecting a suitable starting temperature and a cooling rate, and the present invention provides a GaP red LED which is superior in the forward characteristic and emits high intensity light.

What we claim is:

1. A method of making a light emitting diode using a liquid phase epitaxial method comprising the steps of,
   (a) growing a first p-type epitaxial layer from a gallium melt containing Zn, Ga$_2$O$_3$ and GaP on an n-type GaP substrate at a cooling rate greater than 3° C. per minute, and
   (b) growing a second p-type epitaxial layer from said gallium melt on said first p-type epitaxial layer at a cooling rate less than 1.5° C. per minute.

2. A method of making a light emitting diode in accordance with claim 1, wherein the growth of said second p-type epitaxial layer of step (b) is started immediately after the growth of said first p-type epitaxial layer of step (a) has stopped.

3. A method of making a light emitting diode in accordance with claim 1, including the further step of (c) heating and melting said gallium melt after the growth of said first p-type epitaxial layer and prior to the growth of said second p-type epitaxial layer.

4. A method of making a light emitting diode in accordance with claim 2 or 3, wherein the p-type carrier density at the surface of said second p-type epitaxial layer is higher than the p-type carrier density at the interface between said first p-type epitaxial layer and said second p-type epitaxial layer.

5. A method of making a light emitting diode using a liquid phase epitaxial method comprising the steps of:
   (a) growing a first p-type epitaxial layer at a cooling rate greater than 3° C. per minute from a gallium melt containing Zn, Ga$_2$O$_3$ and GaP on an n-type epitaxial layer formed on an n-type GaP substrate, and
   (b) growing a second p-type epitaxial layer from said gallium melt on said first p-type epitaxial layer at a cooling rate less than 1.5° C. per minute.

6. A method of making a light emitting diode in accordance with claim 5, wherein the growth of said second p-type epitaxial layer of step (b) is started immediately after the growth of said first p-type epitaxial layer of step (a) has stopped.

7. A method of making a light emitting diode in accordance with claim 5, including the first step of (c) heating and melting said gallium melt after the growth of said first p-type epixtaxial layer and prior to the growth of said second p-type epitaxial layer.

8. A method of making a light emitting diode in accordance with claim 6 or 7, wherein the p-type carrier density at the surface of said second p-type epitaxial layer is higher than the p-type carrier density at the interface between said first p-type epitaxial layer and said second p-type epitaxial layer.

* * * * *